United States Patent
Breen et al.

(10) Patent No.: US 6,673,287 B2
(45) Date of Patent: Jan. 6, 2004

(54) VAPOR PHASE SURFACE MODIFICATION OF COMPOSITE SUBSTRATES TO FORM A MOLECULARLY THIN RELEASE LAYER

(75) Inventors: Tricia L. Breen, Hopewell Junction, NY (US); Laura L. Kosbar, Mohegan Lake, NY (US); Michael P. Mastro, Yorktown Heights, NY (US); Ronald W. Nunes, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 09/858,919

(22) Filed: May 16, 2001

(65) Prior Publication Data

US 2002/0172895 A1 Nov. 21, 2002

(51) Int. Cl.[7] .................................. B28B 7/36
(52) U.S. Cl. ........................ 264/83; 264/82; 264/102; 264/219; 264/338; 427/133
(58) Field of Search .................... 264/82, 83, 225, 264/226, 102, 338, 219, 39; 216/41; 430/324; 427/133

(56) References Cited

U.S. PATENT DOCUMENTS

| | | | | |
|---|---|---|---|---|
| 4,775,554 A | * | 10/1988 | Ponjee | 427/133 |
| 5,149,607 A | * | 9/1992 | De Graaf et al. | 430/17 |
| 5,376,172 A | * | 12/1994 | Tripp et al. | 106/490 |
| 5,378,502 A | * | 1/1995 | Willard et al. | 427/305 |
| 5,425,848 A | * | 6/1995 | Haisma et al. | 216/48 |
| 5,484,675 A | * | 1/1996 | Tripp et al. | 430/110.2 |
| 5,512,131 A | * | 4/1996 | Kumar et al. | 438/738 |
| 5,817,242 A | * | 10/1998 | Biebuyck et al. | 216/41 |
| 5,900,160 A | * | 5/1999 | Whitesides et al. | 216/41 |
| 5,925,259 A | * | 7/1999 | Biebuyck et al. | 216/2 |
| 6,027,595 A | * | 2/2000 | Suleski | 156/230 |
| 6,068,801 A | * | 5/2000 | Bodo et al. | 264/39 |

* cited by examiner

Primary Examiner—Allan R. Kuhns
(74) Attorney, Agent, or Firm—Thomas A. Beck; Daniel P. Morris

(57) ABSTRACT

A method of exposing a composite organic/inorganic master to alkylchlorosilanes in the vapor phase. Chlorosilanes participate in facile reactions with hydroxyl groups existing on the surface of inorganic oxides (such as glass or the native oxides on silicon, aluminum, tin, etc.); or those in organics-containing phenolic or alcoholic groups, such as photoresists. The alkyl group on the silane can be chosen from a large selection of aliphatic or aromatic organic groups that have substituents with varying polarity and reactivity.

15 Claims, 6 Drawing Sheets

VAPOR PHASE SURFACE MODIFICATION OF COMPOSITE SUBSTRATES TO FORM A MOLECULARLY THIN RELEASE LAYER

BACKGROUND OF THE INVENTION

1. Field of the Invention

The present invention relates generally to the fabrication of stamps for microcontact printing using a master that contains surfaces of organic materials or composites of organic and inorganic materials, and more particularly a method of modifying the chemical nature of the surfaces of the master through a vapor phase treatment to improve the ease of separation of the stamp from the master.

2. Description of Related Art

Micromolding and microcontact printing as pattern transfer techniques are areas of significant interest for a wide range of applications, especially in the microelectronics industry. Microcontact printing, known as "stamping", techniques are under development as low-cost alternatives to lithography for pattern definition on cost sensitive applications such as flat panel displays. Stamps made from siloxane polymers (such as poly(dimethylsiloxane) (PDMS)) are commonly used due to their ease of fabrication, conformal nature that allows stamping over topographical features, and potential for repeated use to pattern multiple substrates. Stamping has been demonstrated to transfer very thin coatings, down to monolayer coverage, of organics onto surfaces to act as etch barriers, plating seed layers, or ultra-thin patterns that can modify the interaction of the surface with subsequent coatings of organics—either enhancing or resisting deposition of materials in specific areas. Imaging with siloxane stamps has been demonstrated down to submicron dimensions.

In molding and stamping applications, a curable (thermosetting) material, such as PDMS, or a pliable (thermoplastic) material such as a resist is formed into the desired shape by bringing it in contact with a rigid preformed master. Thermoplastic materials are generally cast from a solvent or heated until pliable and conformal with the master. Thermosetting materials are generally composed of monomers or polymer precursors that generally have low viscosity prior to curing (crosslinking), and conform easily to the surface of the master. Curing at room or elevated temperatures or under exposure to an appropriate source of radiation causes crosslinking of the polymer precursors, which will be transformed into an elastic or inelastic solid. To achieve an accurate replication of the master, the polymeric material must be in intimate contact with the surfaces of the master.

After the thermosetting or thermoplastic stamp has been formed to replicate the shape of the master, it must be separated from the master without causing damage to either the stamp or the master. The cured/formed polymer will have reduced flexibility, and may adhere to, or even be chemically bonded to the surface of the master. Adhesion of the stamp to the master increases the difficulty in separating the stamp from the master, and may result in fractures or tears in the polymeric stamp, with the torn sections of the stamp adhering to the master. Tear-outs result in stamps that are imperfect replicas of the master, and are unusable in manufacturing applications that require defect free reproductions. Tear-outs also reduce the utility of the master for production of future articles.

The master itself may be fabricated from a range of materials, although they are generally composed of inorganic materials, such as glass or silicon, or composite structures of an organic material on a glass or silicon substrate, although all organic masters are also feasible. Inorganic masters are generally produced by lithographically patterning a photoresist that has been spun onto the substrate. The exposed and developed photoresist creates a relief pattern that is the inverse of the desired stamp pattern. The patterns on the master may be as small as micron or sub-micron dimensions in width, but are usually several microns deep. Creating relief structures in a silicon or glass substrate requires transferring the resist pattern via wet chemical or plasma etching of the substrate. Such substrates can easily be treated with standard silane or fluorosilane solutions to increase the hydrophobicity of the surface and improve the release of organic materials molded from the master, as described in U.S. Pat. Nos. 5,425,848, 5,817,242 and 6,027,595. Release layers such as the silanes used in these patents are applied in dilute solutions of appropriate nonpolar organic solvents such has alkanes, chlorinated or fluorinated solvents, etc. These solvents provide adequate wetting and minimal interaction with inorganic masters, such as those made of silicon or glass.

A less time-consuming and more cost-effective technique for preparation of masters, also in common usage, is the fabrication of composite masters with a permanent patterned photoresist layer on a glass or silicon substrate. Using this fabrication technique, the exposed and developed resist images form the topographical features that will be replicated in the elastomeric stamp. No mention is made in the literature of treating such masters with release agents. The common solvents for silane release agents produce swelling or distortion of organic films, such as photoresists. Interactions with the organic features on the master limit the utility of solvent applied silanes to produce release layers on organic or composite organic/inorganic masters.

Other examples of the fabrication and uses of microcontact printing stamps and masters include U.S. Pat. No. 5,512,131, which describes the fabrication of elastomeric stamps and the use of these stamps to transfer self-assembled monolayers ("SAM") of molecular species onto a solid substrate; and U.S. Pat. No. 5,900,160 describes the etching of said substrates after transfer of the SAM using an elastomeric stamp. U.S. Pat. No. 5,817,242 describes the use of a deformable layer as part of the stamp to accommodate for unevenness of the substrate being stamped. Fabrication of stamps in this patent includes transfer of resist features from one inorganic substrate to another.

U.S. Pat. Nos. 5,425,848 and 6,027,595 demonstrate the use of stamps to produce patterned resist images using molding techniques; U.S. Pat. No. 5,925,259 employs stamps to provide patterned "microcontainers" for etchants or reactants/catalysts to interact with the substrate in selected areas.

SUMMARY OF THE INVENTION

The present invention comprises exposing a composite organic/inorganic master to alkylchlorosilanes in the vapor phase. Chlorosilanes participate in facile reactions with hydroxyl groups existing on the surface of inorganic oxides (such as glass or the native oxides on silicon, aluminum, tin, etc.); or those in organics-containing phenolic or alcoholic groups, such as photoresists. The alkyl group on the silane can be chosen from a large selection of aliphatic or aromatic organic groups that have substituents with varying polarity and reactivity. The preferred materials to increase the hydrophobicity of the master and minimize adhesion of the stamp are fluorinated aliphatic chlorosilanes with at least eight carbon atoms, or long chain alkyl silanes with at least twelve carbon atoms, although aromatic silanes, such as phenyl silane are also applicable. To avoid swelling or distortion of the organic features on the master that can be caused by exposure to solvents, the chlorosilanes were brought into contact with the master in an evacuated, heated chamber, resulting in reaction of the silanes with all surfaces of the master to produce uniform, hydrophobic surfaces. The temperature of the reaction chamber affects the rate of reaction of the silane with the organic and inorganic surfaces of the master. Since the silanes chemically bond to the surfaces of the master, the hydrophobicity of the surface is retained for preparation of multiple stamps, increasing the useful lifetime (and so lowering the effective cost) of the master.

DETAILED DESCRIPTION OF THE INVENTION

The present invention describes a method for applying a self-assembled monolayer of a release agent to composite organic/inorganic substrates, specifically substrates used as masters for the preparation of elastomeric stamps for microcontact printing. The release layer aids in removal of the elastomeric stamp from the master by decreasing the interaction of the elastomer with the surfaces of the substrate. This reduces damage to both the stamp and the master during the process of separation.

Referring to FIG. 1, a schematic illustration of vapor treatment of a master as part of the process of stamp fabrication is presented. The substrate, 22 (FIG. 1a) is composed of glass, silicon, or a metal with oxide-containing hydroxyl groups on its surface 24. This substrate could also be composed of a rigid or flexible organic or composite material that contains hydroxyl functionality. As illustrated in FIG. 1b, a layer of photoresist 26 is spun on the surface 24 of the substrate, and the photoresist is exposed and developed to produce images that are the inverse of those desired in the final stamp.

The composite of the patterned photoresist on the substrate, which shall be referred to hereinafter as the "master", is placed in a chamber that is then evacuated. The chamber may be heated above room temperature, with the temperature range generally limited to a maximum of 10–20° below the glass transition temperature of the photoresist to minimize deformation of the surfaces of resist images 28. In certain cases, temperature induced deformation of resist images 28 may be desirable, such as to tailor the sidewall slopes of the resist. In these cases, increasing the chamber temperature above the glass transition temperature of the resist will allow a degree of controlled deformation.

Figure 1A:
FIGS. 1(a–g) illustrates the process of master and stamp formation using the disclosed method for vapor phase application of silanes to the master as a release layer prior to stamp fabrication.
Figure 1B:
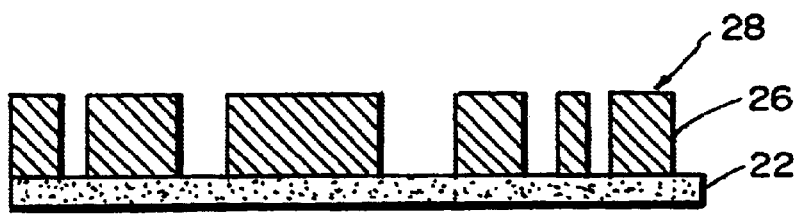
Figure 1C:
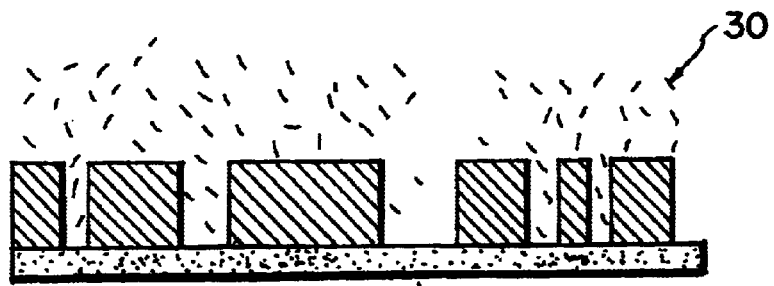
Figure 1D:
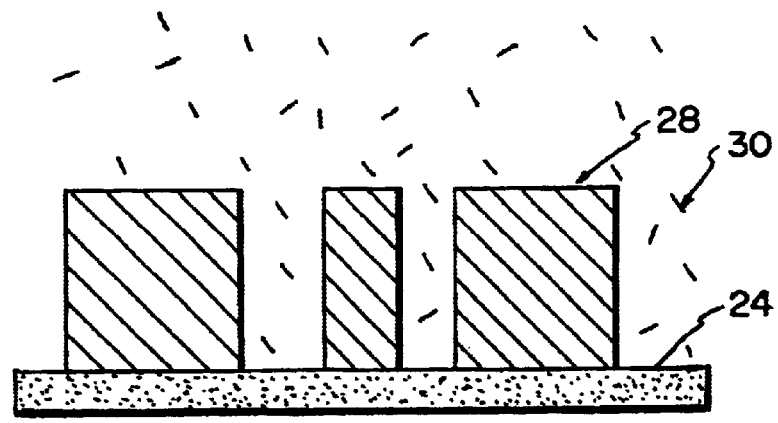

Once the chamber with the master has been evacuated, silane vapor 30 is introduced into the chamber as illustrated in FIGS. 1c–d, generally through opening a valve to a container of the liquid silane. The partial pressure of silane 30 in the chamber may be controlled by the inherent vapor pressure of the selected silane, the temperature of the container in which the silane is held, the vacuum in the chamber, and combinations thereof.

The specific silane may be chosen, according to the present invention, to optimize the desired properties of the surface and accommodate any limitations on processing conditions. The silanes are composed of a head, or reactive group, and a tail group that affects the hydrophobicity and surface free energy of the surfaces to which the silane is bound. For the purposes of this invention, desirable head groups include trichlorosilane, methyldichlorosilane, dimethylchlorosilane, trimethoxysilane, or triethoxysilane. The specified head groups will react with hydroxyl groups on the surface of inorganic substrate 24 and hydroxyl or phenolic groups on the surface of resist 28. For the purposes of this invention, desirable tail groups include alkanes, especially linear alkanes with more than 12 carbons, aromatic groups, and aromatic or aliphatic groups with fluorine substitution, especially linear alkanes with the terminal hydrocarbon(s) completely fluorinated. Highly fluorinated alkanes such as (tridecafluoro-1,1,2,2-tetrahydrooctyl) trichlorosilane or (heptadecafluoro-1,1,2,2-tetrahydrodecyl) trichlorosilane produce particularly highly hydrophobic surfaces on both the organic and inorganic surfaces of the master.

Figure 1E:
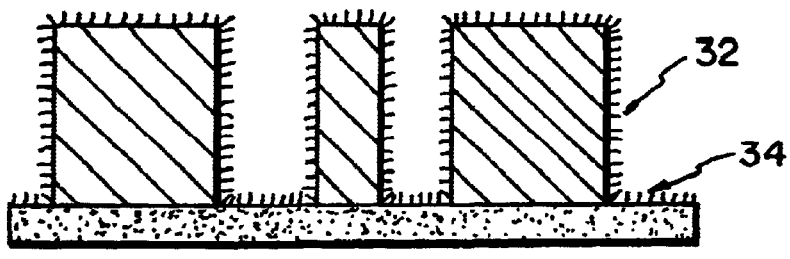

The vapor phase silanes 30 undergo a facile reaction with the surfaces of photoresist 28 and substrate 24 producing monolayer coverage of the silane on the organic 32 and inorganic 34 surfaces of the master (FIG. 1e). The silanes form a covalent bond with the hydroxyls on the organic and inorganic surfaces, creating a stable hydrophobic surface. The isotropic nature of the contact of the silane vapor with all surfaces on the master produces uniform coverage independent on the orientation of, or features on the substrate. The contact time required to achieve full coverage of the surfaces varies with the choice of silane and the temperature of the chamber; but it has been measured to be anywhere from one minute to several hours. Once a uniform monolayer of silane has reacted with the surface, introduction of silane into the chamber ceases and the remaining silane is evacuated prior to removal of the master.

Figure 1F:
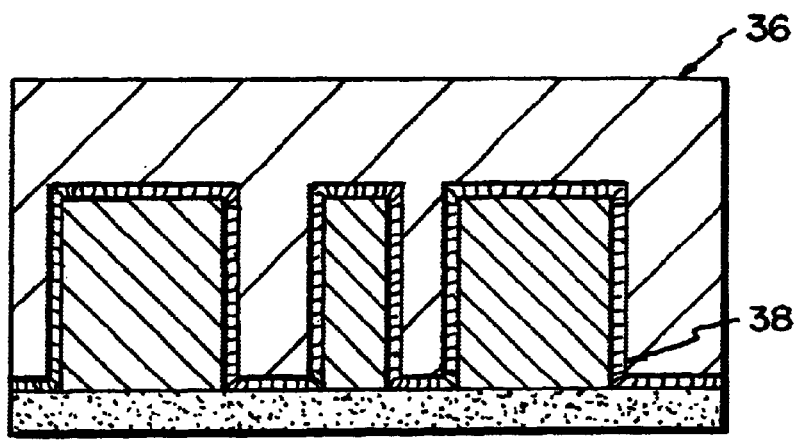
Figure 1G:
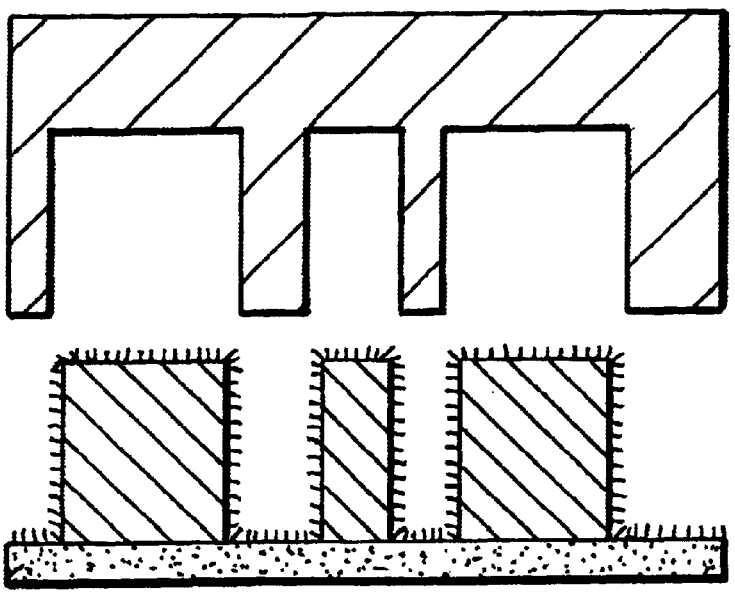

Elastomeric stamps for microcontact printing fabricated by coating the master as indicated in FIG. 1(f) with polymeric precursors, such as siloxanes, and curing the precursors using heat or irradiation to form crosslinked structure 36. The surface of elastomeric stamp 38 is in contact with the silane monolayer, which has minimal interactions with the cured polymer as compared with untreated resist or inorganic substrates. The limited interactions between the elastomer and the master result in minimal forces required to separate the stamp from the master (FIG. 1g), thus reducing defect formation due to adhesion of the elastomer to the master.

Figure 2A:
FIGS. 2(a–c) Scanning electron micrographs (SEMs) that illustrate PDMS tear-out associated with untreated masters.
Figure 2B:
Figure 2C:
Figure 3C:
FIGS. 3(a–f) SEMs of resist images exposed to organic solvents commonly used for silane application that illustrate the swelling, distortion, and loss of adhesion of the resist features that can accompany this method of silane application.
Figure 3B:
Figure 3A:
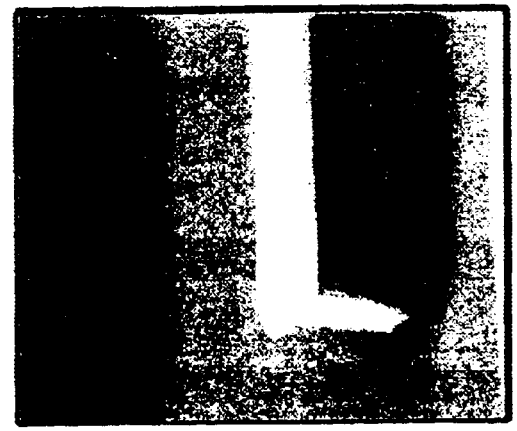
Figure 3F:
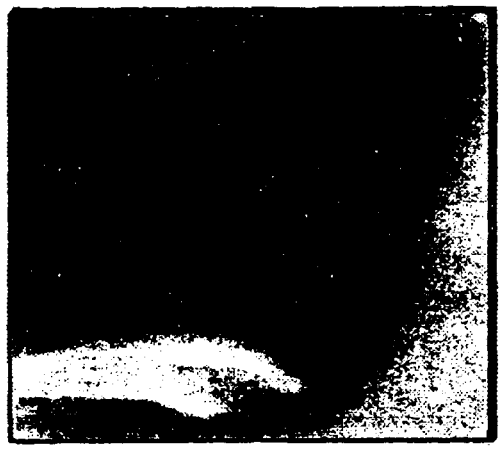
Figure 3E:
Figure 3D:
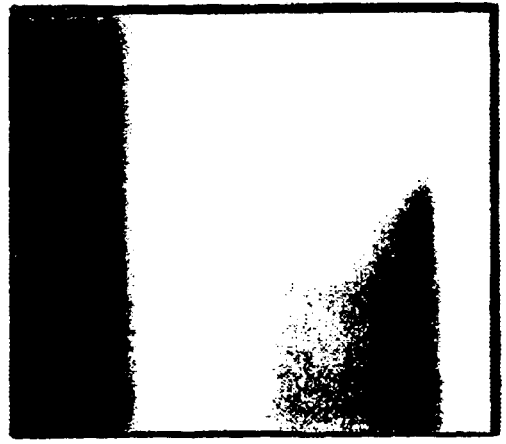
Figure 4A:
FIGS. 4(a–d) SEMs of resist features before and after vapor fluorosilane treatment that illustrate that no change occurs in the resist image due to the vapor silane treatment.
Figure 4B:
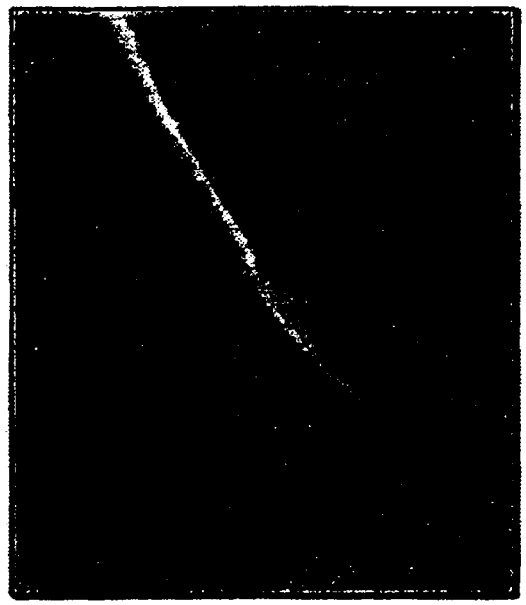
Figure 4C:
Figure 4D:

The invention herein disclosed eliminates several problems with the production of elastomeric stamps for microcontact printing that would otherwise limit their utility in manufacturing applications. As mentioned previously, tear-outs in the elastomer as it is removed from contact with the master often leave pieces of the elastomer adhering to the master (as shown in the SEMs in FIG. 2), which create defects in both the stamp and the master that render them useless. To date, most stamping demonstrations have been accomplished on small, laboratory scale parts where the manufacturing issues of defect free stamps, reproducibility, and reusability of masters have not been primary concerns. As larger stamps, up to 1 meter$^2$ in size, are being developed for flat panel applications the adhesion of the PDMS to the master, and the defects created by this adhesion severely limit manufacturability. The surface treatment disclosed in the present invention reduces the interaction between the elastomeric stamp and the master to a level that requires minimal force for separation, and eliminates tear-outs in the stamp. The process described in the present invention allows the production of stamps free of tear-out defects and improves the potential for reuse of masters.

The traditional solution-based silane treatments used for inorganic masters are incompatible with the less expensive organic/inorganic masters required for cost-effective manufacturing processes. FIG. 3 illustrates the deformation and swelling of photoresist features subjected to solution-based silane treatments. The vapor phase contact with silanes described in this invention avoids any deformation or distortion of the resist images, as demonstrated in the SEM's of untreated and vapor treated resist images depicted in FIG. 4

EXAMPLE 1

A master substrate having an exposed and developed photoresist pattern was fabricated by photolithography. The master was placed in a chamber that was heated to 40° C. and evacuated to 2 torr.

A valve to a container of liquid (tridecafluoro-1,1,2,2-tetrahydrooctyl)trichlorosilane (TFOTS) was opened, allowing vapor of the TFOTS to enter the evacuated chamber and react with the substrate. The chlorosilyl head group undergoes a facile reaction with hydroxyl groups on the surface of the glass as well as with the hydroxyl or phenyl groups in the resist. The fluorinated tail portion of the silane extends outward from the surface of the substrate, increasing the hydrophobicity of both inorganic and organic surfaces. The substrate remained in the evacuated chamber in contact with the TFOTS vapor for 60 minutes, after which the valve to the TFOTS container was closed, and the chamber was flooded with nitrogen. The chamber was evacuated again, and refilled with nitrogen before removing the master.

The contact angle of static drops of water on the surface of both the resist and the glass portions of the master were measured for untreated and fluorosilane-treated masters. Large contact angles with water indicate high hydrophobicity and low surface free energy, which are associated with reduced chemical interactions and adhesion. The contact angle of water on the resist increased from 75° on the untreated sample to 95° on the treated sample. The contact angle of water on the glass portions of the master increased from 40° on the untreated sample to 90° on the treated sample. The fluorosilane treatment significantly increases the hydrophobicity of the glass portions of the master, as well as moderately increasing the hydrophobicity of the resist portions. Perhaps more importantly, the fluorosilane treatment produces a uniform degree of hydrophobicity between the two disparate materials.

A 10:1 (w:w) mixture of PDMS-Sylgard Silicone Elastomer 184 and Sylgard Curing Agent 184, a poly(dimethyl siloxane) precursor and crosslinking agent (Dow Corning Corp. Midland, Mich.) was degassed under vacuum for about 10 minutes, then the mixture was poured over the master. The PDMS cured at 65° C. within 60 minutes to produce an elastomeric stamp. After cooling to room temperature, the PDMS stamp was peeled from the master. Very little, if any force was required to remove the stamp from the template after the master was treated with the fluorosilane vapor, and there was no evidence of PDMS adhering to the master or tear-outs in the stamp.

EXAMPLE 2

A master substrate having an exposed and developed photoresist pattern was fabricated by photolithography. The master was placed in a chamber that was heated to 80° C. and evacuated to 2 torr. A valve to a container of liquid TFOTS was opened. The substrate remained in the evacuated chamber in contact with the TFOTS vapor for 10 minutes, after which the valve to the TFOTS container was closed, and the chamber was flooded with nitrogen. The chamber was evacuated again, and refilled with nitrogen before removing the master. The contact angles of the resist and glass after this treatment averaged 94° and 92° respectively. The PDMS stamp was prepared as described in Example 1, and the stamp was easily removed from the master with no evidence of PDMS adhering to the master.

EXAMPLE 3

A master substrate having an exposed and developed photoresist pattern was fabricated by photolithography. The master was placed in a chamber at room temperature that contained 0.1 ml of octyltrichlorosilane in an open glass vial and the chamber was evacuated to about 10 torr. The substrate remained in the evacuated chamber in contact with the octyltrichlorosilane vapor overnight. The contact angle of water on the glass and the resist after this treatment averaged 98°. The PDMS stamp was prepared as described in Example 1, and the stamp was easily removed from the master with no evidence of PDMS adhering to the master.

What we claim and desire to protect by Letters Patent is:

1. A method for creating a low surface energy, hydrophobic, chemically bonded and molecularly thin release layer on masters using vapor phase silanes that aid in the fabrication of a shaped article of commerce from the master comprising:

a substrate composed of an organic composition containing hydroxyl functionality, or a composite of organic and inorganic materials having hydroxyl groups on the surface thereof;

an organic photoresist layer spun thereon, said photoresist layer having a first and second surface;

exposing and developing said photoresist layer to produce images that are the inverse of those desired in the final shaped article of commerce, said substrate and imaged photoresist forming a master;

placing said master into a chamber and evacuating said chamber and master;

heating said chamber to a temperature in the range between room temperature and approximately 10° C. and 20° C. below the Tg of said organic composition or photoresist;

introducing silanes selected from the group consisting of aliphatic, aromatic chlorosilanes, and alkyl silane in the vapor phase into said chamber, so as to contact said photoresist and said substrate surfaces which are exposed by patterning said photoresist of said master, to form as a reaction product a self-assembled monolayer release layer on said exposed substrate and photoresist surfaces;

evacuating said silane from said chamber;

introducing a composition selected from the group consisting of a curable thermosetting or a thermoplastic polymer onto said master to conform to the shape of said resist features on said master and placing said polymer in intimate contact with said reaction product monolayer release layer coating said surfaces of said master so as to form said shaped article of commerce;

removing said shaped article of commerce from said master.

2. The method of claim 1, wherein said master comprises a composite structure containing a substrate of organic material, inorganic material, or an organic/inorganic composite material, and a patterned organic layer.

3. The method of claim 2, wherein said inorganic material is an inorganic oxide selected from the group consisting of: silicon dioxide, aluminum oxide, tin oxide, glass, and quartz.

4. The method of claim 2 wherein said substrate comprises an organic or material or organic/inorganic composite selected from the group consisting of:

polymers containing hydroxyl functional groups such as epoxy resins, phenol-formaldehyde resins, polysaccharides, and copolymers containing monomers such as vinyl alcohol and methacrylic acid, or polymer composites where the polymeric component contains hydroxyl functional groups such as epoxy fiberglass composites or reinforced phenolic resins.

5. The method of claim 2, wherein said patterned organic layer is selected from the group consisting of: a short-chain organic oligomer having less than ten monomer units, a long-chain organic polymer having at least ten monomer units, a photoresist and mixtures thereof.

6. The method of claim 5, wherein said photoresist is a phenolic-based positive or negative working photoresist.

7. The method of claim 6, in which the organic material substrate is patterned.

8. The method of claim 7, wherein the patterned substrate is used as the master for formation of an elastomeric stamp.

9. The method of claim 1, wherein said silanes are in the vapor phase and are brought into contact with said substrate.

10. The method of claim 9, wherein said aliphatic silanes contain at least 12 carbon atoms.

11. The method of claim 9 wherein the aliphatic or aromatic group attached to the silane is partially or completely fluorinated and contains containing at least 6 carbon atoms with at least two carbon atoms fully fluorinated, or a fully fluorinated phenyl silane.

12. The method of claim 11, wherein said silane is (tridecafluoro-1,1,2,2-tetrahydrooctyl) trichlorosilane.

13. The method of claim 10, wherein said evacuated chamber is heated to increase the reaction rate of the silane with said substrate.

14. The method of claim 1 wherein said vapor silane-treated master is brought into contact with a thermosetting or thermoplastic polymer to replicate the master.

15. The method of claim 14, wherein said polymer is polydimethylsiloxane.

* * * * *